United States Patent [19]
Tyson et al.

[11] Patent Number: 6,022,598
[45] Date of Patent: Feb. 8, 2000

[54] ICB METHOD OF FORMING HIGH REFRACTIVE INDEX FILMS

[75] Inventors: Scott M. Tyson, Albuquerque, N.Mex.; Richard Y. Kwor, Colorado Springs, Colo.; Leonard L. Levenson, deceased, late of Colorado Springs, Colo., by Maryse D. Levenson, executrix

[73] Assignee: United Technologies Corporation, Hartford, Conn.

[21] Appl. No.: 09/061,624

[22] Filed: Apr. 16, 1998

[51] Int. Cl.[7] .................................................. C23C 14/32
[52] U.S. Cl. ...................... 427/561; 427/529; 427/126.4; 427/109; 427/166
[58] Field of Search .................................... 427/561, 566, 427/126.1, 126.4, 126.2, 109, 166, 529

[56] References Cited

U.S. PATENT DOCUMENTS

| | | |
|---|---|---|
| 4,152,478 | 5/1979 | Takagi . |
| 4,217,855 | 8/1980 | Takagi . |
| 4,354,909 | 10/1982 | Takagi et al. ............................ 427/561 |
| 4,800,100 | 1/1989 | Herbots et al. . |
| 4,902,572 | 2/1990 | Horne et al. . |
| 4,944,961 | 7/1990 | Lu et al. .................................. 427/531 |
| 5,350,607 | 9/1994 | Tyson et al. . |
| 5,380,683 | 1/1995 | Tyson et al. . |
| 5,413,820 | 5/1995 | Hayashi . |
| 5,436,035 | 7/1995 | Lohwasser . |
| 5,525,158 | 6/1996 | Tsukazaki et al. . |
| 5,582,879 | 12/1996 | Fujimura et al. ........................ 427/561 |

OTHER PUBLICATIONS

Hulya Demiryont, Electronics and Potential Automotive Applications, Optical Thin Films III: New Developments, 1990, SPIE vol. 1323 pp. 171–187.

*Primary Examiner*—Roy V. King
*Attorney, Agent, or Firm*—Donald S. Holland, Esq.; Holland & Bonzagni, P.C.

[57] ABSTRACT

A uniform film of sapphire and tungsten is deposited onto a surface of a substrate using the ionized cluster beam ("ICB") apparatus. During ICB deposition, a tungsten crucible containing sapphire is heated until a vapor of sapphire and tungsten is formed. The tungsten crucible is heated to form a tungsten vapor, which causes the crucible material to mix with the sapphire, thereby forming a vapor mixture of sapphire and tungsten. The vapor is ejected through a small nozzle into a vacuum region. The resulting adiabatic expansion of the vapor promotes formation of atomic clusters. Some of the clusters are ionized, and electrons are stripped off the clusters. The clusters are accelerated toward the substrate, which is also within the vacuum region. The clusters impact the surface of the substrate, where they are deposited to form the uniform sapphire/tungsten film. The film is deposited in an sapphire (aluminum oxide)/tungsten ratio of 2:1. The film has a relatively high index of refraction of approximately 2.2, thereby rendering it useful as an optical coating (specifically, an electrochromic material). The film may also be used as a resistive or thermally conductive material.

6 Claims, 1 Drawing Sheet

ICB METHOD OF FORMING HIGH REFRACTIVE INDEX FILMS

TECHNICAL FIELD

This invention relates to the ionized cluster beam ("ICB") method of deposition of materials, and more particularly to the ICB deposition of a uniform film comprised of sapphire and tungsten onto a surface of a substrate.

BACKGROUND ART

In the art of deposition of films of material onto a surface of a substrate, there are many known techniques, including vacuum evaporation deposition, ion plating, ion- and plasma-assisted sputtering or chemical vapor deposition ("CVD"), and the more modern ICB approach. ICB deposition is an ion-assisted technique in which the material to be deposited on a substrate is heated in a crucible and its vapor ejected through a small nozzle into a vacuum region. The vapor forms loosely-held atomic clusters, each cluster comprising 100 to 2000 atoms of the material. Some of the ejected vaporized atomic material is ionized by electron bombardment and the atoms are accelerated toward the substrate disposed in the vacuum region. The ionized material, together with the neutral (i.e., non-ionized) component of the vapor, arrive at the substrate surface for deposition thereon. ICB deposition offers the ability to precisely control the deposited film structure by applying kinetic energy to the vapor clusters during film deposition. Kinetic energy control is achieved by varying the acceleration voltage and the electron current for ionization.

In most of the known ion- and plasma-assisted deposition techniques, the individual atoms of the material to be deposited on the substrate generally impact the substrate surface with excessive kinetic energy, producing a relatively high number of defects in the substrate and/or the deposited film. With ICB deposition, a more useful lateral energy is obtained as the clusters impact the substrate and the atoms break off, without damaging the film and substrate. Due to the effects of ionized cluster bombardment, ICB deposition produces films with high density, strong adhesion, a low impurity level, and a smooth surface. Also, film properties usually associated with relatively high substrate temperatures in conventional vacuum depositions can be obtained at lower substrate temperatures in the ICB technique. This results in a distinct advantage in semiconductor device fabrication. Examples of the ICB method of deposition of films of material onto a substrate are found in U.S. Pat. Nos. 4152478, 4217855, 5350607 and 5380683, all of which are hereby incorporated by reference.

Recent advances have been made in the field of eleclrochromics. As used herein, "electrochromics" refers to color-active glass materials that change their color and other optical properties (i.e., transmittance and reflectance) in response to an applied electric field. A number of different materials have been investigated for use as electrochromics. One of these materials is tungsten oxide, $WO_3$. See, for example, Demiryont, "Electrochromics and Potential Automotive Applications", *Optical Thin Films III: New Developments*, SPIE Vol. 1323, (1990), pp. 171–187, which is hereby incorporated by reference. Tungsten oxide has desirable optical properties, including a relatively high (e.g., 2.1) index of refraction.

DISCLOSURE OF INVENTION

Objects of the invention include the ICB deposition of a uniform film of sapphire (an oxide of aluminum) and tungsten onto a surface of a substrate, wherein the film is deposited in an aluminum oxide/tungsten ratio of 2:1, and wherein the film has a relatively high index of refraction of approximately 2.2, thereby rendering it useful as an optical coating (specifically, an electrochromic material). Other objects of the present invention include the use of the ICB deposited film of sapphire and tungsten as a resistive material or as a thermally conductive material.

According to the invention, a mixture of sapphire and tungsten is deposited as a uniform film over an exposed surface of a substrate using the ICB deposition technique. The substrate may comprise a glass material or other material, such as silicon. The substrate material chosen depends upon the ultimate application of the deposited film.

In the ICB deposition process, a tungsten crucible containing the sapphire starting material is heated until a vapor of sapphire (aluminum oxide) and tungsten is formed. Specifically, the tungsten cricible is heated to a sufficient temperature to cause a tungsten vapor to form. This causes the tungsten crucible material to mix with the sapphire starting material within the crucible, thereby forming a mixture of sapphire and tungsten which is vaporized. The sapphire/tungsten vapor is ejected through a small nozzle into a vacuum region. The resulting adiabatic expansion of the vapor promotes formation of atomic clusters. Some of the clusters are ionized, and electrons are stripped off the clusters. The clusters are accelerated toward the substrate, which is also within the vacuum region. The clusters impact the surface of the substrate, where they are deposited to form the uniform sapphire/tungsten layer.

The above and other objects and advantages of this invention will become more readily apparent when the following description is read in conjunction with the accompanying drawings.

BEST MODE FOR CARRYING OUT THE INVENTION

Figure 1:
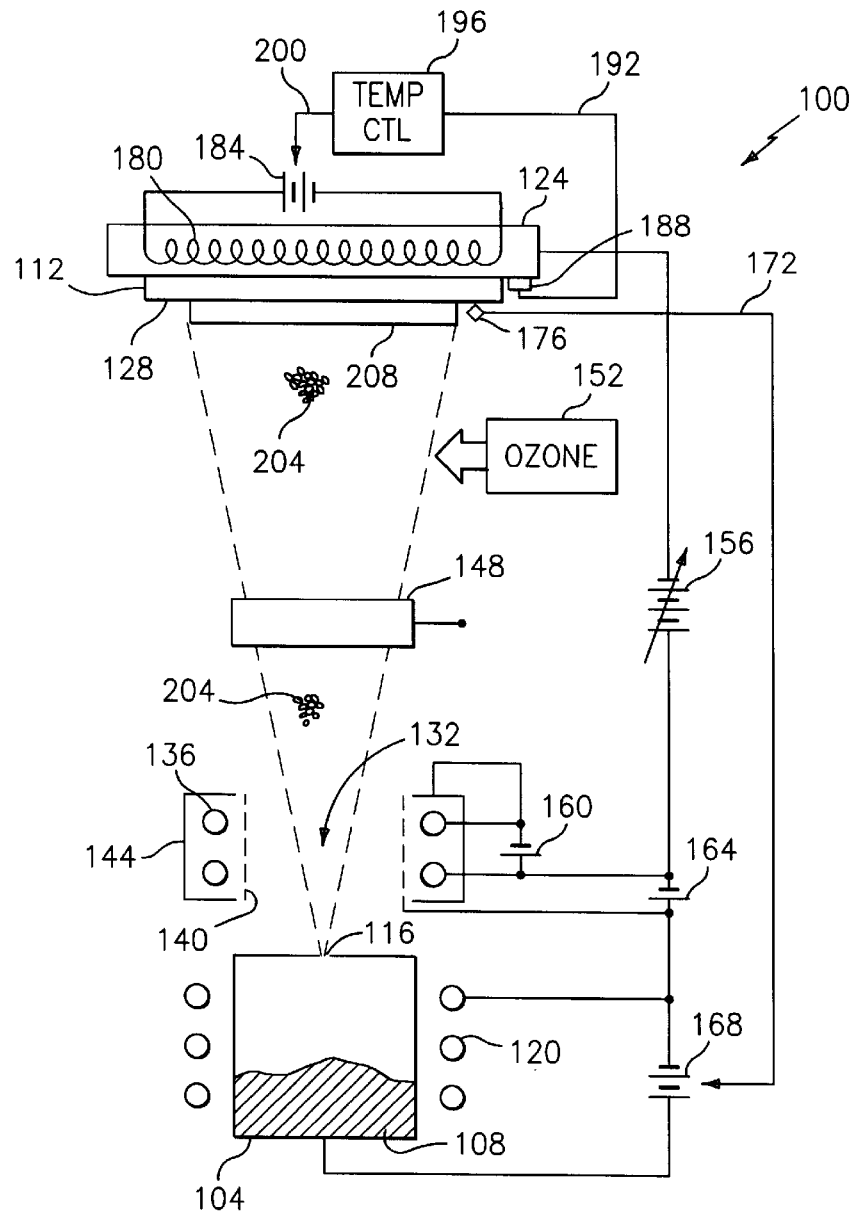
FIG. 1 is a schematic illustration of ICB apparatus for depositing a uniform layer of sapphire and tungsten onto a surface of a substrate, in accordance with the method of the present invention.

Referring to FIG. 1, the known ICB material deposition apparatus 100 illustrated therein is available from, e.g., Mitsubishi Corporation, Itami Works, Hyogo, Japan. The basic operating principles of the ICB apparatus 100 follow. Clusters of atomic material to be deposited on a surface of a substrate are formed by adiabatic expansion of material vapor passing through a nozzle. The clusters are then ionized by impact ionization using electrons of an appropriate energy. Cluster sizes distribute in a range of, e.g., 100 to 2000 atoms per cluster. The clusters bombard the substrate surface, and both ionized and neutral clusters are broken up and redistributed due to the high surface mobility of the loosely-held clusters. The scattered atoms may move over the substrate surface with such surface diffusion energy before they are physically attracted to the substrate; surface. Such attraction is due to high kinetic energy parallel to the surface caused by conversion from the incident kinetic energy. The crystallographic structure and physical properties of thin films deposited using the ICB apparatus 100 are found to be strongly dependent upon the energy of the ionized material. This energy is controlled by the acceleration voltage during film deposition and, to a lesser extent, by substrate temperature.

The method of depositing a uniform film of sapphire (an oxide of aluminum) and tungsten onto a surface of a substrate, in accordance with a preferred exemplary embodiment of the present invention, is described hereinafter with reference to the figures, with particular reference initially to FIG. 1. The ICB apparatus 100 includes a crucible 104 containing the sapphire starting material 108 to be deposited onto a surface of a substrate 112. The substrate may comprise glass or other material, depending upon the ultimate application of the deposited film. The crucible 104 comprises tungsten. The crucible 104 may contain the sapphire material 108 in any physical form. The physical form of the sapphire material 108 in the crucible 104 is irrelevant, since the material is heated to a vapor state.

The crucible 104 has at least one small diameter ejection nozzle 116, along with heating elements 120, e.g., filaments, disposed adjacent the crucible walls. The filaments 120 heat the crucible by emitting electrons which impact the crucible. However, crucible heating may occur through other methods. One is radiation heating where heat is generated by a crucible heating filament. Another is resistance heating. The method chosen for heating the crucible 104 is irrelevant to the present invention.

A substrate holder 124 comprises an electrically-conductive material. As described in detail hereinafter, a surface 128 of the substrate 112 has the uniform film of sapphire and tungsten deposited thereon by the ICB apparatus 100 in accordance with the present invention.

Disposed above and in proximity to the ejection nozzle 116 is an ionization chamber 132. The chamber 132 has one or more filaments 136 for emitting electrons. The chamber 132 also has acceleration electrodes 140 for accelerating the emitted electrons, and a shield 144 for preventing undesirable scattering of the electrons. Disposed above the chamber 132 is a shutter 148, which selectively prevents the vapor ejected from the crucible 104 from impinging onto the substrate surface 128.

All of the aforementioned components of the ICB machine 100 are disposed within a vacuum region or chamber having a pressure of preferably $1.33 \times 10^{-3}$ Pascals ("Pa") or less. An ozone source 152 may be provided for injecting a flow rate of ozone into the vacuum chamber.

A variable power supply 156 is connected between the substrate holder 124 and the ionization chamber 132. The supply 156 maintains the substrate holder at a relatively high negative potential with respect to the chamber. The electric field imparts kinetic energy to the positively ionized vaporized clusters for their accelerated movement toward the substrate surface 128. A second power supply 160 is connected across the filaments 136 in the chamber 132. The supply 160 energizes the filaments 136, causing them to emit electrons.

A third power supply 164 is connected between the filaments 136 and acceleration electrodes 140. The supply 164 keeps the acceleration electrodes 140 at a highly positive potential with respect to the filaments 136. This potential accelerates the electrons emitted from the filaments 136 and ionizes some of the clusters in the ionization chamber 132. This third power supply 164 thus provides an ionization current.

A fourth power supply 168 energizes the crucible filaments 120. The filaments 120 emit electrons which impact and, thus, heat the crucible 104. The supply 168 may be controlled by a signal on a line 172 provided by a quartz crystal 176. The crystal 176, which vibrates at a measurable frequency, is disposed in close proximity to the substrate 112. As more of the sapphire and tungsten material 108 is deposited onto the substrate surface 128, the vibration frequency of the crystal 176 decreases. Since the change in the vibration frequency is related to the deposition rate, the crystal provides a simple method of monitoring the deposition rate of the sapphire/tungsten film onto the substrate surface 128. The supply 168 is responsive to the signal on the line 172 to vary the temperature of the crucible 104. For example, as the alloy deposition rate decreases, the crucible may be heated to increase the deposition rate.

The substrate holder 124 contains a coil 180 for heating the substrate 112 to a temperature which facilitates deposition of the film onto the substrate 112. A power supply 184 powers the coil in the substrate holder 124. A thermocouple 188 attached to the substrate provides a signal on a line 192 indicative of the temperature of the substrate 112. The signal is fed to a circuit 196 which compares the actual substrate temperature on the line 192 with a desired substrate temperature provided by an operator of the ICB apparatus 100. Any difference therebetween is provided on a signal line 200 to control the power supply 184.

In light of the foregoing description of the ICB machine 100, a description of the method of the present invention for depositing the uniform film of sapphire and tungsten onto a surface of a substrate 112 follows. Still referring to FIG. 1, the sapphire starting material 108 is loaded into the crucible 104. The substrate 112 is loaded into the substrate holder 124. The crucible heating filaments 120 and the substrate heater 180 are energized by the corresponding power supplies 168,184. As the crucible 104 heats up, the sapphire material 108 therewitthin becomes a vapor.

However, in accordance with the present invention, the filaments 120 heat the crucible 104 to a desired temperature to form a tungsten vapor. This causes the tungsten material comprising the crucible 104 to mix with the sapphire starting material 108 within the crucible. Thus, the sapphire vapor within the crucible 104 also contains vaporized tungsten. The crucible temperature is regulated so that the pressures of the sapphire/tungsten vapor in the crucible may exceed at least 100 times the pressure outside the crucible in the vacuum region. The greater the difference between the internal and external pressures of the crucible, the greater the ejection velocity of the vaporized material exiting the crucible.

The shutter 148 is opened to allow the sapphire/tungsten vapor ejected from the nozzle 116 of the crucible 104 to travel toward the substrate 112. The substrate heater 180 heats the substrate to a temperature of 300 to 700 degrees C. The acceleration power supply 156 is initially set between 50 electron volts ("eV") and 5 thousand electron volts ("keV"). The ionization current power supply 164 is adjusted to provide an ionization current of 200 to 300 milliamps ("mA"). The ozone source 152 is adjusted to provide an oxygen partial pressure within the high vacuum region in the range of $6.66 \times 10^{-3}$ Pa to $13.33 \times 10^{-3}$ Pa.

The sapphire/tungsten vapor in the crucible 104 is ejected into the vacuum region where it is supercooled due to adiabatic expansion. As a result, the vapor forms atomic groups or clusters 204, each cluster 204 typically comprising approximately 100 to 2000 atoms loosely bonded together by van der Waals attractive forces.

Through kinetic energy imparted to the vapor when ejected through the nozzle 116, the vapor clusters 204 enter the ionization chamber 132. There, the clusters 204 are bombarded by electrons emitted from the filaments 136. The electron bombardment ionizes at least one atom within some of the clusters 204, thus forming partially ionized clusters 204. The ionization current is controlled by the ionization power supply 164. Other clusters 204 are not ionized and, thus, remain neutral.

The acceleration power supply 156 imparts kinetic energy to the ionized clusters 204 to move and accelerate them toward the substrate 112. The energies imparted to the ionized clusters are controlled through variation of the acceleration power supply 156. The neutral clusters 204 also move toward the substrate 112 by the action of the kinetic energy received by the clusters when ejected from the crucible nozzle 116. When the clusters 204 reach the substrate surface 128, both types of clusters impinge on the surface, forming thereon a high quality, uniform film 208 of sapphire and tungsten.

When the ionized clusters 204 collide with the substrate 112, most of the kinetic energy of the clusters is converted into thermal energy. This energy is imparted to the film 208 of sapphire and tungsten material being deposited on the substrate surface 128. At the same time, each ionized cluster 204 itself is disintegrated into individual atomic particles, which move onto the deposited film 208 to facilitate growth of the film due to the migration effects. Such effects can also be expected in the case of the neutral or non-ionized clusters 204. The migration effects are created at an elevated temperature caused by the thermal energy converted from the kinetic energy of the clusters and imparted to the deposited film 208. Once the film 208 has been formed, the shutter 148 is closed, all power supplies are turned off, and the resulting substrate 112 having the sapphire and tungsten film 208 formed thereon is allowed to cool before being removed from the ICB apparatus 100.

A preferred exemplary thickness of the deposited film 208 is approximately 3000 Angstroms. The film 208 was preferably deposited at a rate of approximately 100–200 Angstroms per minute. Approximately 1800 watts of power for the ICB apparatus 100 was needed to achieve this relatively high deposition rate. This deposition rate is in contrast to typical known, prior art ICB deposition of films which were performed at a lower rate of approximately 35–40 Angstroms per minute.

Figure 2:
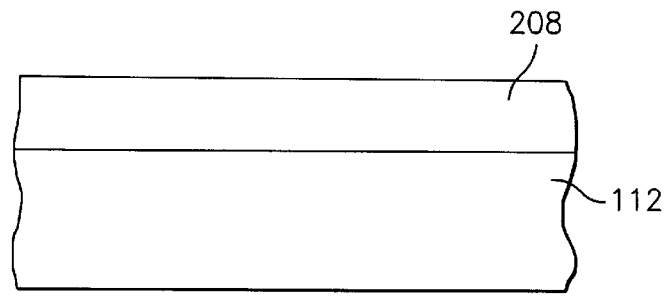
FIG. 2 is a cross-sectional illustration of the substrate having the uniform layer of sapphire and tungsten deposited on a surface thereof by the ICB apparatus of FIG. 1, in accordance with the method of the present invention.

FIG. 2 illustrates the substrate 112 having the uniform film 208 of sapphire and tungsten deposited thereon. It has been empirically discovered that the deposited film 208 is amorphous and in a sapphire to tungsten ratio of approximately 2:1. The film 208 appears to be thermally stable over a relatively wide temperature range. It was also empirically discovered that, among multiple depositions, a high degree of uniformity (approximately 1%) appears to have been achieved. Also, varying the substrate temperature or the deposition rate (within the above-noted range) appears to have exerted little influence on the resulting index of refraction.

The sapphire/tungsten film 208 has utility in that the film 208 has a relatively high index of refraction (e.g., 2.2). This allows the film 208 to be used as an optical coating in various applications. Specifically, the film 208 may be used as an elecrochromic material. As such, the substrate 112 may comprise glass or other material. In the alternative, it is anticipated that the film 208 may be utilized as a resistive material or as a thermally conductive material.

The method of the present invention has been described herein as utilizing a tungsten crucible 104 having only sapphire 108 deposited therein. The tungsten crucible 104 is then heated to a temperature that causes a tungsten vapor to form. This allows the tungsten material to mix with the sapphire material 108 within the crucible prior to be vaporized. However, it is to be understood that the sapphire material 108 within the crucible 104 may be mixed directly with tungsten material placed into the crucible 104 in a desired amount to achieve the desired ratio of sapphire to tungsten in the resulting deposited film 208. As such, it is then anticipated that the temperature of the crucible may be lowered so as to not cause a tungsten vapor to form.

It should be understood by those skilled in the art that obvious structural modifications can be made, in light of the teachings herein, without departing from the scope of the invention. Accordingly, reference should be made primarily to the accompanying claims, rather than the foregoing specification, to determine the scope of the invention.

Having thus described the invention, what is claimed is:

1. A method of forming a film comprised of sapphire and tungsten, the method comprising the steps of:

providing a substrate having a surface;

providing sapphire material in a crucible comprised of tungsten material, the crucible having a nozzle;

heating the crucible to a predetermined temperature to cause a tungsten vapor to form, thereby causing the tungsten material to mix with the sapphire material within the crucible, the heating step also causing the mixture of sapphire material and tungsten material within the crucible to be vaporized at a predetermined vapor pressure, the crucible vapor pressure being greater in magnitude than a predetermined pressure value of a vacuum region external to the crucible, thereby causing the vapor to be ejected through the nozzle and into the vacuum region and forming clusters of atoms of the sapphire material and the tungsten material by adiabatic expansion, the atomic clusters being formed in the vacuum region outside of the crucible in the vicinity of the nozzle;

bombarding the atomic clusters with electrons, thereby resulting in at least one of the atomic clusters being partially ionized along with any remaining atomic clusters remaining non-ionized; and accelerating both the ionized and non-ionized atomic clusters toward the surface of the substrate, thereby forming the film comprised of sapphire and tungsten on the surface of the substrate.

2. The method of claim 1, wherein the film is comprised of sapphire and tungsten in a sapphire to tungsten ratio of 2:1.

3. The method of claim 1, wherein the the film is deposited on the surface of the substrate at a rate of at least 100 Angstroms per minute.

4. A method of forming a film comprised of sapphire and tungsten, the method comprising the steps of:

providing a substrate having a surface;

providing sapphire material and tungsten material in a mixture within a crucible, the crucible having a nozzle;

heating the crucible to a predetermined temperature to cause the sapphire material and tungsten material mixture within the crucible to be vaporized at a predetermined vapor pressure, the crucible vapor pressure being greater in magnitude than a predetermined pressure value of a vacuum region external to the crucible, thereby causing the vapor to be ejected through the nozzle and into the vacuum region and forming clusters of atoms of the sapphire material and the tungsten material by adiabatic expansion, the atomic clusters being formed in the vacuum region outside of the crucible in the vicinity of the nozzle;

bombarding the atomic clusters with electrons, thereby resulting in at least one of the atomic clusters being partially ionized along with any remaining atomic clusters remaining non-ionized; and accelerating both the ionized and non-ionized atomic clusters toward the surface of the substrate, thereby forming the film comprised of sapphire and tungsten on the surface of the substrate.

5. The method of claim 4, wherein the film is comprised of sapphire and tungsten in a sapphire to tungsten ratio of 2:1.

6. The method of claim 4, wherein the the film is deposited on the surface of the substrate at a rate of at least 100 Angstroms per minute.

* * * * *

UNITED STATES PATENT AND TRADEMARK OFFICE
CERTIFICATE OF CORRECTION

PATENT NO. : 6,022,598

DATED : February 8, 2000

INVENTOR(S) : Scott M. Tyson et al.

It is certified that error appears in the above-identified patent and that said Letters Patent is hereby corrected as shown below:

Column 1, line 51 change "elecIro" to --electro--.

Column 2, line 19, change "cricible" to --crucible--;

line 63, delete the ";" (semi-colon) between "substrate" and "surface".

Column 4, line 35, change "therewitthin" to --therewithin--.

Signed and Sealed this

Twenty-seventh Day of March, 2001

Attest:

NICHOLAS P. GODICI

Attesting Officer

Acting Director of the United States Patent and Trademark Office